(12) United States Patent
Hashii et al.

(10) Patent No.: US 9,550,264 B2
(45) Date of Patent: Jan. 24, 2017

(54) FIXED ABRASIVE-GRAIN PROCESSING DEVICE, METHOD OF FIXED ABRASIVE-GRAIN PROCESSING, AND METHOD FOR PRODUCING SEMICONDUCTOR WAFER

(75) Inventors: Tomohiro Hashii, Tokyo (JP); Yuichi Kakizono, Tokyo (JP); Yoshiaki Kurosawa, Tokyo (JP)

(73) Assignee: SUMCO CORPORATION, Tokyo (JP)

( * ) Notice: Subject to any disclaimer, the term of this patent is extended or adjusted under 35 U.S.C. 154(b) by 780 days.

(21) Appl. No.: 13/322,955

(22) PCT Filed: Jun. 4, 2010

(86) PCT No.: PCT/JP2010/059548
§ 371 (c)(1),
(2), (4) Date: Nov. 29, 2011

(87) PCT Pub. No.: WO2010/140684
PCT Pub. Date: Dec. 9, 2010

(65) Prior Publication Data
US 2012/0071064 A1 Mar. 22, 2012

(30) Foreign Application Priority Data

Jun. 4, 2009 (JP) .................................. 2009-135295
Aug. 25, 2009 (JP) .................................. 2009-193838

(51) Int. Cl.
*B24B 1/00* (2006.01)
*B24B 7/22* (2006.01)
(Continued)

(52) U.S. Cl.
CPC .................. *B24B 7/228* (2013.01); *B24D 7/06* (2013.01); *H01L 21/02013* (2013.01)

(58) Field of Classification Search
CPC ....... B24B 7/228; B24D 7/06; H01L 21/02013
(Continued)

(56) References Cited

U.S. PATENT DOCUMENTS 6,120,352 A * 9/2000 Duescher ........................ 451/41
6,465,328 B1 * 10/2002 Hashii et al. ................. 438/459
(Continued)

FOREIGN PATENT DOCUMENTS

JP          9-174425         7/1997
JP          09174425 A  *   7/1997    ............ B24B 37/04
(Continued)

OTHER PUBLICATIONS

JP 2006-198701A English Machine Translation.*
JP 2006-237055A—English Machine Translation.*

*Primary Examiner* — Joseph J Hail
*Assistant Examiner* — Marc Carlson
(74) *Attorney, Agent, or Firm* — Greenblum & Bernstein, P.L.C.

(57) ABSTRACT

Disclosure relates to a fixed abrasive-grain processing device and a method of fixed abrasive-grain processing used for producing a semiconductor wafer, and a method for producing a semiconductor wafer which make the surface of the semiconductor wafer possible to have preferable flatness and which can prevent the number of steps and the installation area of facilities from increasing. The producing of semiconductor wafers uses a fixed abrasive-grain processing device including a lower fixed abrasive-grain layer that is adjacent to the top surface of the lower surface-plate and that grinds the top surfaces of the plurality of semiconductor wafers; an upper fixed abrasive-grain layer that is adjacent to the bottom surface of the upper surface-plate and that grinds the bottom surfaces of the plurality of semiconductor wafers; a carrier plate that is horizontally interposed between the lower surface-plate and the upper surface-plate (Continued)

and that includes a plurality of holes each accommodating one of the plurality of semiconductor wafers; and a carrier rotating device that circularly moves the carrier plate, wherein the lower fixed abrasive-grain layer and the upper fixed abrasive-grain layer include fixed abrasive grain having a diameter of 4 μm or less and being dispersed and fixed in elastic members.

5 Claims, 11 Drawing Sheets

(51) Int. Cl.
  *B24D 7/06* (2006.01)
  *H01L 21/02* (2006.01)
(58) Field of Classification Search
  USPC .............. 451/41, 57; 438/691; 257/E21.237
  See application file for complete search history.

(56) References Cited

U.S. PATENT DOCUMENTS

| | | | |
|---|---|---|---|
| 6,753,256 B2* | 6/2004 | Hashii et al. ................ 438/689 |
| 7,601,644 B2 | 10/2009 | Koyata et al. | |
| 8,092,277 B2* | 1/2012 | Hashii et al. .................. 451/41 |
| 2002/0016072 A1* | 2/2002 | Hashii et al. ................ 438/690 |
| 2003/0162482 A1* | 8/2003 | Okuhata et al. ............... 451/41 |
| 2003/0181141 A1* | 9/2003 | Taniguchi et al. ............. 451/36 |
| 2006/0002283 A1* | 1/2006 | Horisaka et al. .......... 369/272.1 |
| 2006/0169667 A1* | 8/2006 | Koyata et al. ................. 216/52 |
| 2007/0023395 A1* | 2/2007 | Asakawa ........................ 216/88 |
| 2007/0026770 A1* | 2/2007 | Fletcher et al. ................ 451/41 |
| 2007/0054607 A1* | 3/2007 | Yasuoka ................ B24B 37/08 451/56 |
| 2007/0123152 A1* | 5/2007 | Shteinvas et al. .............. 451/11 |
| 2007/0184658 A1* | 8/2007 | Koyata et al. ................ 438/689 |
| 2007/0224821 A1* | 9/2007 | Koyata et al. ................ 438/691 |
| 2008/0014839 A1* | 1/2008 | Pietsch et al. ................. 451/41 |
| 2008/0113510 A1* | 5/2008 | Kato et al. .................... 438/691 |
| 2009/0311808 A1* | 12/2009 | Hashii et al. ..................... 438/8 |
| 2009/0311863 A1* | 12/2009 | Hashii et al. ................ 438/691 |
| 2009/0311948 A1* | 12/2009 | Hashii et al. ................. 451/44 |
| 2009/0311949 A1* | 12/2009 | Hashii et al. .................. 451/54 |
| 2010/0006982 A1* | 1/2010 | Hashii et al. ................. 257/618 |
| 2010/0022171 A1* | 1/2010 | Naguib et al. ................. 451/41 |
| 2010/0048105 A1* | 2/2010 | Fletcher et al. ................ 451/57 |
| 2010/0190418 A1* | 7/2010 | Yasuoka et al. ............... 451/56 |
| 2012/0315739 A1* | 12/2012 | Hashii et al. ................ 438/460 |

FOREIGN PATENT DOCUMENTS

| | | | |
|---|---|---|---|
| JP | H 09-174425 A | * | 7/1997 |
| JP | 2006-100799 | | 4/2006 |
| JP | 2006100799 A | * | 4/2006 |
| JP | 2006-198701 | | 8/2006 |
| JP | 2006198701 A | * | 8/2006 |
| JP | 2006-237055 | | 9/2006 |
| JP | 2006237055 A | * | 9/2006 |

* cited by examiner

MANY DROPS

LITTLE DROPS

FIXED ABRASIVE-GRAIN PROCESSING DEVICE, METHOD OF FIXED ABRASIVE-GRAIN PROCESSING, AND METHOD FOR PRODUCING SEMICONDUCTOR WAFER

TECHNICAL FIELD

The present invention relates to a fixed abrasive-grain processing device and a method of fixed abrasive-grain processing used for producing a semiconductor wafer, and a method for producing a semiconductor wafer.

BACKGROUND

The methods illustrated in FIGS. 15 and 16 are known as conventional methods of producing a semiconductor (silicon) wafer.

In the method of FIG. 15, firstly in a slicing step S110 a single-crystal ingot is sliced into wafers W; in a beveling step S120 the edge (circumference) of the wafer W is beveled; in a lapping step S130 the both surfaces of a number of wafers W are concurrently lapped with abrasive grain (free abrasive grain) being relatively coarse (i.e. batch lapping), which is followed by an etching step S140 and a mirror-surface polishing step S150. Thereby, the wafers W after subjected to the lapping are formed into final products.

The lapping step S130 will now be detailed. The lapping step S130 is carried out through the use of a lapping device 100 as illustrated in FIG. 17. The lapping device 100 includes a lower surface-plate 101 having an upward supporting surface 101a; an upper surface-plate 102 having a supporting surface 102a that overlies the supporting surface 101a of the lower surface-plate 101; a sun gear 103 disposed at the inner radius of the lower surface-plate 101; an internal gear 104 disposed at the outer circumference of the lower surface-plate 101; a carrier plate 105 that is interposed between the supporting surface 101a of the lower surface-plate 101 and the supporting surface 102a of the upper surface-plate 102 and that engages with the sun gear 103 and the internal gear 104; and a slurry supplying device 106 that supplies wafers W set inside respective holes 105a of the carrier plate 105 with a slurry containing relatively rough abrasive grain (free abrasive grain having a granularity of #1000 through #1500).

While the lower surface-plate 101 and the upper surface-plate 102 are rotating relatively to each other, the sun gear 103 and the internal gear 104 cause the carrier plate 105 to make planet motion, so that free abrasive grain supplied to the supporting surfaces 101a and 102a from the slurry supplying device 106 laps the both surfaces of a number of wafers W set in each hole 105a at the same time.

In the meantime, in a method shown in FIG. 16, in a slicing step S210 a single-crystal ingot is sliced into wafers W. In the subsequent grinding step S220 the top surface and the bottom surface of a wafer W one surface for each time is ground with abrasive grain (fixed abrasive grain) having a relatively coarse granularity (single-wafer grinding). The ground wafer W is then subjected to a beveling step S230, an etching step S240, and a mirror-surface polishing step S250 to be formed into a final product.

The grinding step S220 will now be detailed. In the grinding step S220 a grinding device 200 shown in FIGS. 18(a) and 18(b) is used. The grinding device 200 includes a turntable 201; a chuck 202 that overlies the turntable 201 and that vacuum sucks a wafer W; a grindstone support 204 that overlies the chuck 202 and having a grindstone 203 fixed thereto; and a grinding-water supplying device 205 that supplies a wafer W with grinding water. The grindstone 203 is formed of abrasive grain having a granularity of, for example, #300 through #1000.

While the turntable 201 and the grindstone support 204 are rotating relatively to each other and the grinding-water supplying device 205 is supplying the grinding water, the grindstone 203 is pressed against the surface of a wafer W, so that the top and the bottom surfaces of the wafer W is ground one surface for each time.

The lapping device 100 and the grinding device 200 are disclosed in Patent Reference 1.

However, processing wafers W in the methods of FIGS. 15 and 16 may sometime leave scratches on the surface of the mirror-polished wafer W. In other words, since in the lapping step S130 and the grinding step S220 carried out before the mirror-surface polishing relatively coarse abrasive grain is used, the subsequent normal mirror-surface polishing sometime does not completely remove all scratches on the surface.

For the above, as shown in FIGS. 19 and 20, finish grinding steps S135 and S225 are carried out after the lapping step S130 and the grinding step S220, respectively and before the mirror-surface polishing step S150 or S250, respectively. The finish grinding steps S135 and S225 use abrasive grain having a granularity of #2000 through #8000, such as resin-bonded grindstone, and which relatively encourages self-sharpening to finish the top and the bottom surface of a wafer W by polishing one surface for each time.

PRIOR ART REFERENCE

Patent Reference

[Patent Reference 1] Japanese Laid-Open Patent Publication No. 2006-100799

SUMMARY

Problems to be Solved by Invention

However, the methods shown in FIGS. 19 and 20 increase the number of steps for the finishing grinding steps S135 and S225, which accompany increase in required facilities.

Furthermore, in accordance with increase in diameter of a wafer W (specifically, the diameter being 450 mm), the lapping step S130 requires a lapping device 100 large in size, which requires a large installation area. There are required an increased number of grinding devices 200 used in the grinding step S220, which are however smaller in size than the lapping device 100, because each device 100 processes one wafer W for each time. Therefore, the grinding devices 200 also require a large installation area.

With the foregoing problems in view, a first object of the present invention is to provide a fixed abrasive-grain processing device and a method of fixed abrasive-grain processing which make it possible to obtain a semiconductor wafer having a surface of a preferable flatness. A second object of the present invention is to provide a method for producing a semiconductor wafer which requires a less number of steps and thereby prevents a required installation area of the facilities from increasing.

Means to Solve the Problem

In order to attain the first object, there is provided a fixed abrasive-grain processing device used in production of a plurality of semiconductor wafers, the device including: a disk-shaped lower surface-plate horizontally disposed; a lower fixed abrasive-grain layer that is adjacent to the top surface of the lower surface-plate and that grinds the top surfaces of the plurality of semiconductor wafers; a first motor that rotates the lower surface-plate around an axis of rotation; a disk-shaped upper surface-plate that horizontally overlies the lower surface-plate; an upper fixed abrasive-grain layer that is adjacent to the bottom surface of the upper surface-plate and that grinds the bottom surfaces of the plurality of semiconductor wafers; a second motor that rotates the upper surface-plate around the axis of rotation; a carrier plate that is horizontally interposed between the lower surface-plate and the upper surface-plate and that includes a plurality of holes each accommodate one of the plurality of semiconductor wafers; and a carrier rotating device that circularly moves the carrier plate, wherein the lower fixed abrasive-grain layer and the upper fixed abrasive-grain layer include abrasive grain having a diameter of 4 μm or less and being dispersed and fixed in elastic members.

Preferably, the lower surface-plate and the upper surface-plate apply pressure of 250-400 g/cm$^2$ to the top surfaces and the bottom surfaces of the plurality of semiconductor wafers, respectively.

Preferably, the abrasive grain in the elastic members has a concentration ratio of 100-150.

Preferably, the fixed abrasive-grain processing device further includes: a first intermediate layer that is interposed between the lower fixed abrasive-grain layer and the top surface of the lower surface-plate; and a second intermediate layer that is interposed between the upper fixed abrasive-grain layer and the bottom surface of the upper surface-plate, wherein the lower fixed abrasive-grain layer and the upper fixed abrasive-grain layer each have a thickness of 100-2000 μm.

There is provided a method of fixed abrasive-grain processing using the above fixed abrasive-grain processing device, the method including the steps of: under a state of the upper surface-plate separated from the lower surface-plate, setting the plurality of semiconductor wafers in the holes of the carrier plate, bringing the upper surface-plate close to the lower surface-plate; pressing the lower fixed abrasive-grain layer and the upper fixed abrasive-grain layer against the top surfaces and the bottom surfaces of the plurality of semiconductor wafers, respectively; and planarizing the top surfaces and the bottom surfaces of the plurality of semiconductor wafers at the same time by the lower fixed abrasive-grain layer and the upper fixed abrasive-grain layer being in contact with the top surfaces and the bottom surfaces, respectively, through rotation of the lower surface-plate and the upper surface-plate and circular movement of the carrier plate concurrently with the rotation.

To attain the second object, there is provided a method for producing a semiconductor wafer including the above fixed abrasive-grain processing, the method comprising the steps of: before the fixed abrasive-grain processing, slicing a single-crystal ingot into the plurality of semiconductor wafers; and after the fixed abrasive-grain processing, mirror-surface polishing the top surfaces and the bottom surfaces, or at least the top surfaces of the plurality of semiconductor wafers until the top surface and the bottom surface, or at least the top surface exhibits a mirror surface.

Preferably, the method further includes the steps of: after the fixed abrasive-grain processing and before the mirror-surface polishing, beveling edges of the plurality of semiconductor wafers ground in the fixed abrasive-grain processing; and after the beveling and before the mirror-surface polishing, single-wafer etching one of the plurality of semiconductor wafers at each time by spraying a surface of the one semiconductor wafer in a rotating state with an etching solution.

Effects of Invention

According to the fixed abrasive-grain processing device and the method of fixed abrasive-grain processing of the present invention, semiconductor wafers are processed through the use of fine abrasive grain (fixed abrasive grain) which has a granularity diameter of 4 μm or less and which is dispersed and fixed in elastic members, so that resultant wafer surfaces have a preferable flatness. The elasticity of the elastic members makes the elastic members to properly absorb force that the abrasive grains apply to the wafers when the abrasive grains are pressed against the wafers, so that each wafer can be prevented from being damaged by scratch caused by concentrating an excessive force to a single point of the wafer.

Setting the pressure that the lower surface-plate and the upper surface-plate apply to the top and the bottom surface of a semiconductor wafer to be 250-400 g/cm$^2$ which is higher than a generic value 100-150 g/cm$^2$ makes it possible to avoid scratches on the surfaces of the wafers, concurrently processing the semiconductor wafers at a high processing rate.

Furthermore, lowering the concentration ratio (hereinafter simply called the "concentration ratio") of the abrasive grain in the elastic member from a generic value around 200 to 100-150 causes the fixed abrasive grain to easily drop from the surface of the elastic members during processing of semiconductor wafers. Consequently, a high processing rate can be stably maintained not only at the initial stage of processing semiconductor wafers but also in the middle of the processing.

The intermediate layers are interposed between the lower fixed abrasive-grain layer and the top surface of the lower surface-plate and between the upper fixed abrasive-grain layer and the bottom surface of the upper surface-plate. Given the lower fixed abrasive-grain layer and the upper fixed abrasive-grain layer both have thicknesses of 100-2000 μm, the lower limit of 100 μm can prevent the intermediate layers from being in direct contact with the wafer and the upper limit of 2000 μm can avoid excessive load on the elastic members of the lower fixed abrasive-grain layer and the upper fixed abrasive-grain layer which load has a possibility of lowering the strength of the elastic members to lead to break of the elastic members.

Additionally, the flatness, which has conventionally been obtained by two steps of a lapping step and a finish grinding step, can be obtained by a single step of the fixed abrasive-grain processing through the use of the fixed abrasive grain. Consequently, application of this fixed abrasive-grain processing to producing of semiconductor wafers can decrease the number of steps and refrain the number of required facilities from increasing, thereby preventing the installation area of the facilities from increasing.

According to the method of producing semiconductor wafers of the present invention, since the flatness, which has conventionally been obtained by two steps of a lapping step and a finish grinding step, can be obtained by a single step of the fixed abrasive-grain processing through the use of the

BEST MODE TO CARRY OUT INVENTION

Hereinafter, a description will now be made with reference to the accompanying drawings.

Embodiment

A method of producing a semiconductor wafer, and a fixed abrasive-grain processing device and a method of fixed abrasive grain processing used in the method of producing a semiconductor wafer will now be described with reference to FIGS. 1 through 5.

<Configuration>

Figure 4:
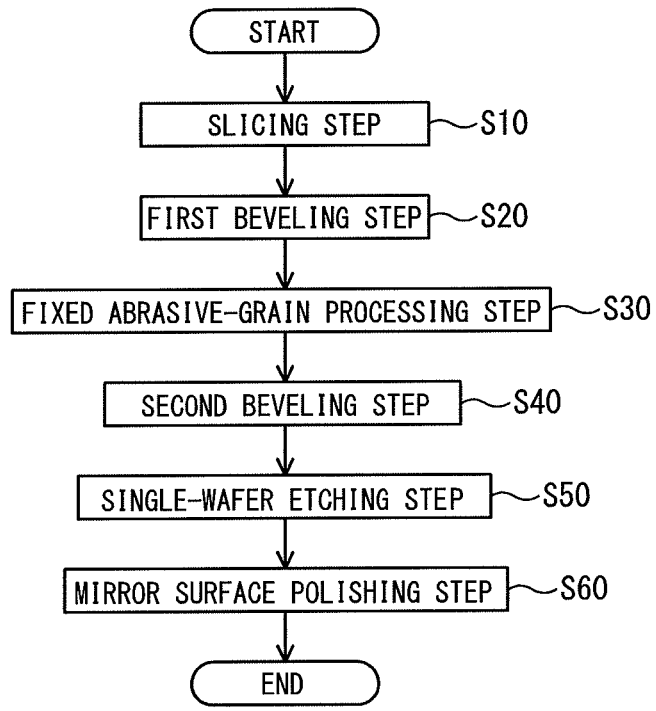
FIG. 4 A flow diagram illustrating a method of producing a semiconductor wafer according to the embodiment.

As illustrated in FIG. 4, the method of producing a semiconductor wafer of the embodiment includes a slicing step S10; a first beveling step S20; a fixed abrasive-grain processing step S30 (a method of processing by fixed abrasive grain); a second beveling step S40; a single-wafer etching step S50; and a mirror surface polishing step S60.

In the slicing step S10, a single-crystal ingot is sliced with a known slicing device, such as a wire saw or an inner diamond blade, into semiconductor wafers W.

For example, a semiconductor wafer W may be a monocrystalline silicon wafer or a polycrystalline silicon wafer, and may have a diameter of 200 mm, 300 mm, or 450 mm.

In the first beveling step S20, the edge of the wafer W sliced in the slicing step S10 is grinded so as to be rounded (beveled).

In the fixed abrasive-grain processing step S30, the top and the bottom surfaces of a number of wafers W are ground for planarization by a fixed abrasive-grain processing device 1 as will be detailed below.

In the second beveling step S40, the edges of the wafers W subjected to the fixed abrasive-grain processing step S30 are beveled.

In the single-wafer etching step S50, the wafer W is rotated by any known single-wafer etching device, and the surface of the rotating wafer W is sprayed with an etching solution, so that the wafer W can be etched one surface for each time.

In the mirror surface polishing step S60, the top and bottom surfaces of the wafer W or at least the top surface etched in the single-wafer etching step S50 is polished by any known mirror-surface polishing device until the surface becomes a mirror surface.

Here, the fixed abrasive-grain processing device 1 and the method of processing through the use of the fixed abrasive-grain processing device 1 according to the embodiment will now be detailed.

The fixed abrasive-grain processing device 1 may be, for example, a known lapping device, double-side grinding device, or double-side polishing device.

Figure 1:
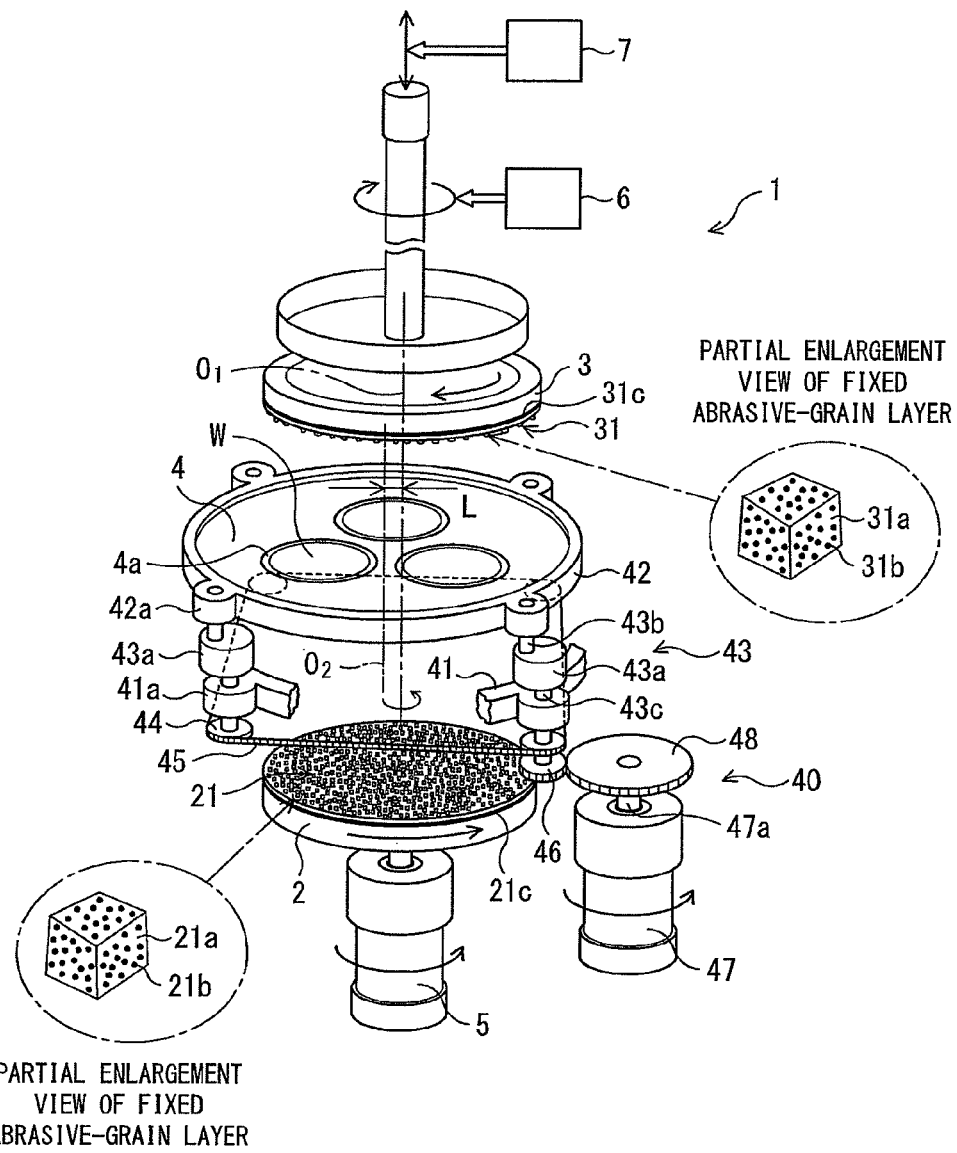
FIG. 1 A schematic perspective view of the entire configuration of a fixed abrasive-grain processing device used for a method of producing a semiconductor wafer according to an embodiment of the present invention, separating respective elements.
Figure 2:
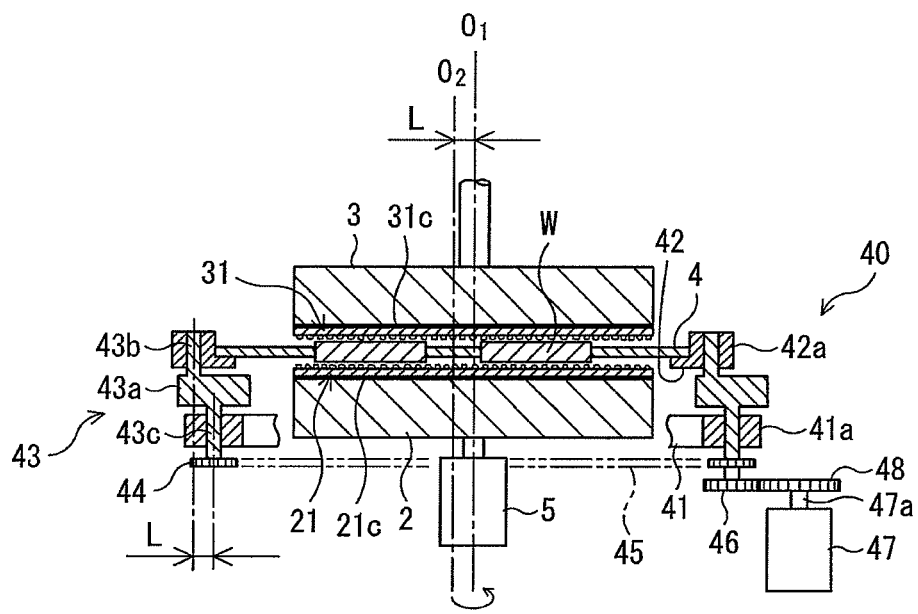
FIG. 2 A sectional view of a fixed abrasive-grain processing device used for a method of producing a semiconductor wafer according to the embodiment.
Figure 3:
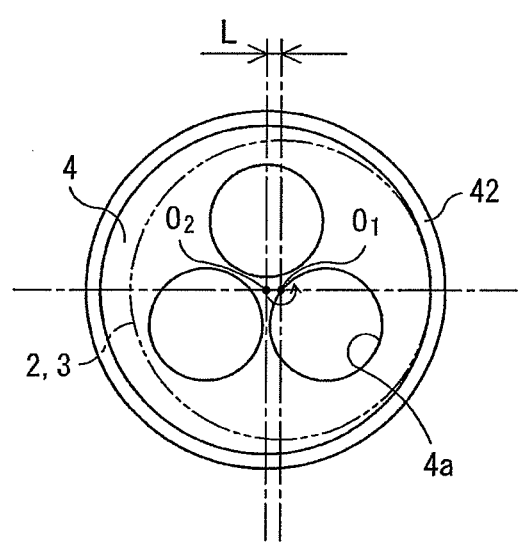
FIG. 3 A top view of a carrier plate of a fixed abrasive-grain processing device used for a method of producing a semiconductor wafer according to the embodiment.

As illustrated in FIGS. 1 through 3, the fixed abrasive-grain processing device 1 of the embodiment is a sun-gear-absent type, and includes a disk-shaped lower surface-plate 2 disposed horizontally, a disk-shaped upper surface-plate 3 horizontally overlies the lower surface-plate 2 and faces the lower surface-plate 2, and a carrier plate 4 horizontally interposed between the lower surface-plate 2 and the upper surface-plate 3 and includes a number of holes 4a that accommodate wafers W. As an example, the carrier plate 4 is made of glass epoxy and has a thickness of 700 μm.

The lower surface-plate 2 and the upper surface-plate 3 rotate at 5-30 rpm. Rotating at a speed less than 5 rpm causes a disadvantage of lowering the processing rate while rotating at a speed more than 30 rpm causes another disadvantage of spinning out the wafer during the processing. A preferable speed of the surface-plates 2 and 3 is 10-25 rpm within which preferable effects of a constant processing rate and flatness can be both maintained.

The lower surface-plate 2 and the upper surface-plate 3 may rotate at the same speed or at different speeds. Furthermore, the lower surface-plate 2 and the upper surface-plate 3 may rotate in the same direction or different directions.

A fixed abrasive-grain layer (lower fixed abrasive-grain layer) 21 is adjacent to the top surface of the lower surface-plate 2, and a fixed abrasive-grain layer (upper fixed abrasive-grain layer) 31 is adjacent to the bottom surface of the upper surface-plate 3. The lower fixed abrasive-grain layer 21 and the upper fixed abrasive-grain layer 31 include fine abrasive grains (fixed abrasive grains) 21b and 31b having a diameter (average diameter) less than 4 μm and being dispersed and fixed in elastic members 21a and 31a, respectively.

The elastic members 21a and 31a are preferably made of hardening polymer resin (e.g., epoxy resin, phenolic resin, acrylicurethane resin, polyurethane resin, vinyl chloride resin, fluorinated resin). The diameter of the fixed abrasive grains 21b and 31b is preferably 1 μm or more and less than 4 μm, more preferably 1 μm or more and less than 2 μm. The numeric range of 1 μm or more and less than 4 μm is based on the problems that a diameter of 4 μm or more generates scratches on the surface of a wafer W while a diameter less than 1 μm lowers the grinding rate. The abrasive grain is made of diamond, silica, SiC, alumina, or zirconia.

As illustrated in FIG. 2, intermediate layers 21c and 31c (also referred to as adhesive layers) are interposed between the top surface of the lower surface-plate 2 and the lower fixed abrasive-grain layer 21 and between the bottom surface of the upper surface-plate 3 and the upper fixed abrasive-grain layer 31, respectively.

The lower fixed abrasive-grain layer 21 and the upper fixed abrasive-grain layer 31 have thicknesses of 100 through 2000 μm. A thickness less than 100 μm causes a problem of the intermediate layers 21c and 31c coming into direct contact with a wafer W. A thickness more than 2000 μm imposes an excessive load on the elastic member 21a or 31a, which decreases the strength of the elastic member 21a or 31a to lead to brake of the elastic member. The lower fixed abrasive-grain layer 21 and the upper fixed abrasive-grain layer 31 more preferably have thicknesses of 300 through 1800 μm. This range can ensure preferable effects of stable processing and prolonging the life of the elastic members.

Figure 6:
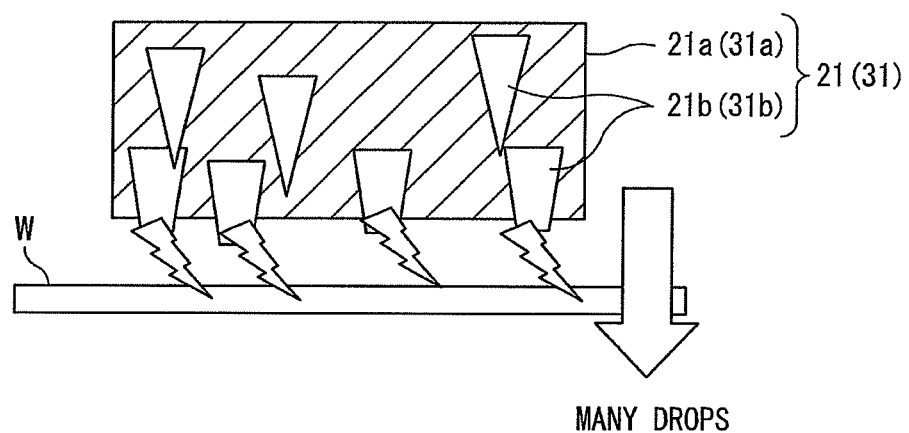
FIG. 6 An enlarged sectional view of the main part of fixed abrasive-grain processing of the embodiment at the concentration ratio of 100.

The fixed abrasive grain 21b and the fixed abrasive grain 31b in the elastic member 21a and the elastic member 31a, respectively have concentration ratios (densities or degrees of dispersion) of 100-150. As shown in FIG. 6, lowering a concentration ratio from a generic value around 200 to 100-150 makes fixed abrasive grains 21b and 31b that come to be incapable of grinding when processing the wafers W easily drop from the surfaces of the elastic members 21a and 31a. Consequently, a high grinding rate can be stably maintained not only at the initial stage of processing wafers W but also in the middle of the processing.

Specifically, when the fixed abrasive grains 21b and 31b grind wafers W, the fixed abrasive grains 21b and 31b supported in the respective elastic members 21a and 31a rub the top surface and the bottom surface of each wafer W, so that grinding proceeds by gradually grinding off part of the top and the bottom surfaces of the wafer W with sharp angles of the fixed abrasive grains 21b and 31b. In accordance with the grinding, fixed abrasive grains 21b and 31b which are exposed at the surfaces of the elastic members 21a and 31a and whose sharp angles are rounded as the grinding proceeds gradually drop from the surface of the elastic members 21a and 31a. At the initial stage of the grinding, since there are contained a little fixed abrasive grains 21b and 31b whose sharp angles are rounded after being used for grinding, the grinding rate of wafers W is high.

Figure 7:
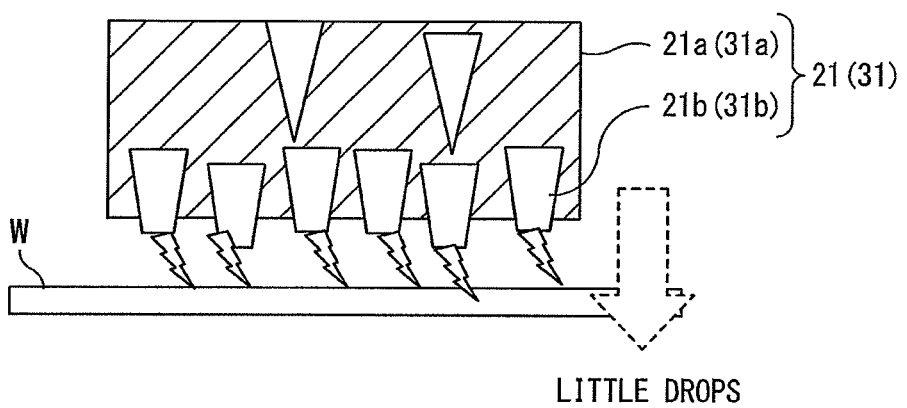
FIG. 7 An enlarged sectional view of the main part of operation in a fixed abrasive-grain processing of the embodiment at the concentration ratio of 200.

However, as the grinding proceeds, an increased number of fixed abrasive grains 21b and 31b whose sharp angles are rounded through being used for grinding appear on the surfaces of the elastic members 21a and 31a. As illustrated in FIG. 7, when the concentration rate is a generic value 200 or more, the fixed abrasive grains 21b and 31b whose sharp angles are rounded are present at a high density over the entire surfaces of the elastic members 21a and 31a. For the above, even though grinding of the wafers W are continued, the pressure is subdividedly dispersed to a large number of fixed abrasive grains 21b and 31b covering the surfaces of the elastic members 21a and 31a and thereby, the fixed abrasive grains 21b and 31b whose sharp angles are rounded are hard to drop from the surface of the elastic members 21a and 31a. Consequently, after the middle stage of the grinding, the fixed abrasive grains 21b and 31b whose sharp angles are rounded rub the top and the bottom surfaces of the wafers W only to develop scratches on the surfaces, so that the top and the bottom surfaces of each wafer W are scarcely ground.

However, the present invention, which reduces the concentration ratio to 100 through 150, lowers the densities of the fixed abrasive grains 21b and 31b at the surfaces of the elastic members 21a and 31a, respectively. For the above, loads are intensively applied to fixed abrasive grains 21b and 31b which come to be incapable of grinding because the sharp angles thereof are rounded in order to enhance the dropping of such grains. The next-stage fixed abrasive grains 21b and 31b to those fixed near to the surface of the elastic members 21a and 31a come to be exposed and the sharp angle of the next-stage fixed abrasive grains 21b and 31b allows to maintain a high grindability of the top and the bottom surfaces of the wafers W at all times of the grinding.

The term "concentration ratio" here represents a content of abrasive grain in an elastic member containing the abrasive grains. The concentration ratio when abrasive grain of 4.4 cts (0.88 g) is contained in an elastic member of 1 cm$^3$ is assumed to be 100. A concentration ratio less than 100 causes a problem of lowering the processability while a concentration ratio more than 150 causes another problem of lowering the autogenous activity of the abrasive grains. A concentration ratio in the range of 100-150 ensures preferable effects of both enhancement in autogenous activity of abrasive grains and stabilizing the processing rate.

As described above, the carrier plate 4 includes a number of holes 4a which accommodate wafers W and which are arranged at regular intervals along the circumference of the carrier plate 4. Three holes 4a appear in the drawing, but the number of holes 4a is not limited as long as the number is except for one.

The fixed abrasive-grain processing device 1 further includes a motor (motor for lower surface-plate) 5 that rotates the lower surface-plate 2; a motor (motor for upper surface-plate) 6 that rotates the upper surface-plate 3; a cylinder (lifting device) 7 that moves the upper surface-plate 3 up and down such that the upper surface-plate 3 comes close to and away from the lower surface-plate 2; and a press mechanism (not illustrated) that presses one of or both the lower surface-plate 2 and the upper surface-plate 3 in such a direction that the two surface-plates come close to each other with the intention that both the lower surface-plate 2 and the upper surface-plate 3 press wafers W.

The lower surface-plate 2 and the upper surface-plate 3 both rotate about an axis $O_1$ of rotation. For example, the press mechanism is preferably an air-bag type incorporated into each of the lower surface-plate 2 and the upper surface-plate 3.

The fixed abrasive-grain processing device 1 further includes a carrier rotating device 40 that circularly moves the carrier plate 4 in a horizontal plane on a small circler but does not cause the carrier plate 4 to rotate around the center of the carrier plate 4 itself.

The carrier rotating device 40 includes a basement 41, a carrier holder 42, eccentric arms 43, sprockets 44, a timing chain 45, a small gear (first gear) 46, a motor (carrier motor) 47, and a large gear (second gear) 48.

The basement 41 is a circular part serving as the skeleton of the carrier rotating device 40 and includes four bearings (basement bearings) 41a that stick out to the exterior and that are disposed on the circumference at intervals of 90 degrees.

The carrier holder 42 is a circular part that holds the carrier plate 4 and is interposed between the lower surface-plate 2 and the upper surface-plate 3 such that the center axis $O_2$ thereof is eccentric from the axis $O_1$ of rotation of the lower surface-plate 2 and the upper surface-plate 3 by a length L. The center axis $O_2$ of the carrier holder 42 rotates on a circle whose center is the axis $O_1$ of rotation and whose radius is L. The carrier plate 4 circularly moves in conjunction with the carrier holder 42, which however does not accompany rotation around the center of the carrier plate 4 itself. The carrier holder 42 includes four bearings (holder bearings) 42a that stick out to the exterior and that are disposed on the outer circumference at intervals of 90 degrees.

There are provided four eccentric arms 43 one for each holder bearing 42a of the carrier holder 42. Each eccentric arm 43 includes a base 43a in the surface-plate shape, an eccentric axis 43b disposed at an eccentric point on the top surface of the base 43a and protruded upward, and a rotating axis 43c disposed at the center of the bottom surface of the base 43a and protruded downward.

The eccentric axis 43b is eccentric to the rotating axis 43c by the distance L, and is inserted into the holder bearing 42a of the carrier holder 42 to be fixed to the holder bearing 42a. The rotating axis 43c is rotatably attached to the basement bearing 41a of the basement 41. One end of the rotating axis 43c is downwardly projected from the bottom of the basement bearing 41a and the sprocket 44 is fixed to the projected end. The timing chain 45 is horizontally looped around the sprockets 44.

The sprockets 44 and the timing chain 45 are configured to be synchronizing means that the rotating axes 43c of the four eccentric arms 43 concurrently rotate such that the four eccentric arms 43 synchronize with one another to rotate the eccentric axes 43b on circles whose centers are rotating axes 43c and whose radii are L.

Alternatively, the synchronizing means including the sprockets 44 and the timing chain 45 may be replaced by another synchronizing means (including, for example, a power transmission system of a gear configuration), which synchronizes the four eccentric arms with one another.

The small gear 46 is fixed to an end of the rotating axis 43c of a predetermined one of the eccentric arms 43. In other words, only one of the four eccentric arms 43 has the rotating axis 43c longer in length, which has an end to which a small gear 46 is fixed.

The carrier motor 47 serves as driving means that circularly moves the carrier plate 4 and the carrier holder 42 in conjunction with each other, and includes an output axis 47a protruded upwardly.

The large gear 48 is fixed to the output axis 47a of the carrier motor 47 and has a larger diameter than the small gear 46, which engages with the large gear 48.

Here, the basement 41 includes four sets each of which includes the basement bearing 41a, the holder bearing 42a of the carrier holder 42, the eccentric arm 43, and the sprocket 44. The number of sets is not limited to four and any number (e.g., three) can be suggested as long as the carrier holder 42 can be stably supported.

Figure 5:
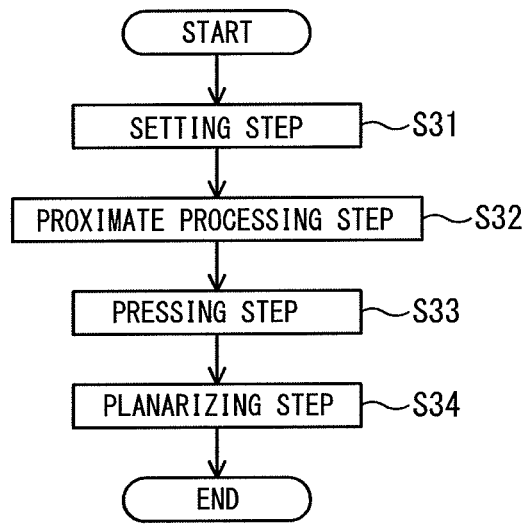
FIG. 5 A flow diagram illustrating fixed abrasive-grain processing in a method of producing a semiconductor wafer of the embodiment.

The fixed abrasive-grain processing device 1 having the above configuration concurrently planarizes the both surfaces of a number (here, three) of wafers W in the procedure, as shown in FIG. 5, in a fixed abrasive-grain processing step S30.

Specifically, first of all, in a setting step S31 under a state of the upper surface-plate 3 separated from the lower surface-plate 2, wafers W are set into the holes 4a of the carrier plate 4 by a non-illustrated robot device.

In succession, in a proximate processing step S32, the cylinder 7 moves the upper surface-plate 3 in the proximity of the lower surface-plate 2.

Then, in a pressing step S33, the press mechanism presses the fixed abrasive-grain layers 21 and 31, more specifically fixed abrasive grains 21b and 31b, of the lower surface-plate 2 and the upper surface-plate 3 against the top surface and the bottom surface of the wafers W respectively.

In the pressing step S33, the pressure that the lower surface-plate 2 and the upper surface-plate 3 apply to the bottom and the top surfaces of the wafers W (hereinafter simply called "pressure") is 250-400 $g/cm^2$. A pressure less than 250 $g/cm^2$ causes a problem of lowering the processing rate while a pressure more than 400 $g/cm^2$ causes problem of fracture of wafers due to heavy load. A preferable pressure is 300-350 $g/cm^2$. A pressure in this range ensures the preferable effect of stable processing, which can be prevented from lowering.

Next, in a planarizing step S34, the motor 5 for lower surface-plate and the motor 6 for upper surface-plate rotate the lower surface-plate 2 and the upper surface-plate 3, respectively and concurrently the carrier motor 47 circularly moves the carrier plate 4, so that the bottom and the top surfaces of the wafers W come into contact with the fixed abrasive-grain layer 21 and 31, which planarize the top and the bottom surfaces of the wafers W at the same time.

Here, operation of the carrier rotating device 40 in the planarizing step S34 will now be detailed.

When the output axis 47a of the carrier motor 47 is rotated, the rotary force of the output axis 47a is transferred to the rotating axes 43c of all the eccentric arms 43 via the large gear 48, the small gear 46, the sprockets 44, and the timing chain 45, so that the eccentric arms 43 rotate around the respective rotating axes 43c in synchronization with one another. Since the carrier holder 42 is coupled to the eccentric axes 43b each eccentric to one of the rotating axes 43c of the carrier holder 42 and consequently, the carrier plate 4 held by the carrier holder 42 is circularly moved by circular motion of the eccentric axes 43b such that the center axis $O_2$ rotates on a circle whose center is the axis $O_1$ of rotation and whose radius is L and such that the carrier holder 42 and the carrier plate 4 do not rotate around the centers thereof.

A speed of circular motion of the carrier plate 4 not accompanying rotation around the center thereof is 1-15 rpm. A speed less than 1 rpm makes it impossible to uniformly grind the top and the bottom surfaces of the wafers W while a speed more than 15 rpm causes a problem of scratches on the edge face of the wafers W held in the holes 4a of the carrier plate 4.

Action and Effects

The method of producing a semiconductor wafer, the fixed abrasive-grain processing device, and the method of the processing thereof detailed above according to the embodiment of the present invention have the following effects.

Figure 18A:
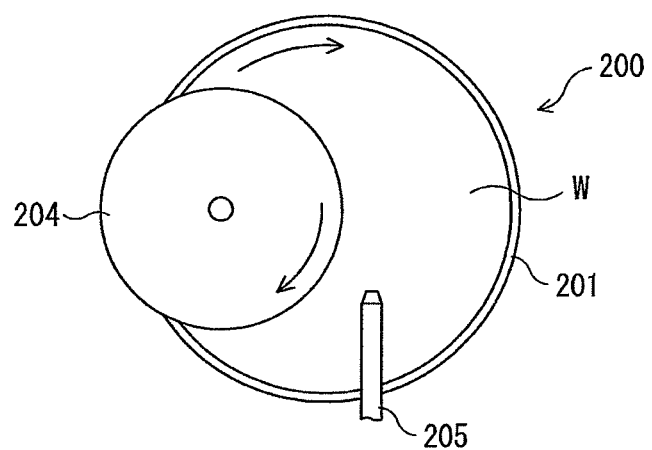
FIG. 18 Schematic diagrams illustrating a grinding device used in a method of producing a semiconductor wafer according to the second conventional method, FIG. 18 (a) and FIG. 18 (b) being a top view and a sectional view thereof.
Figure 18B:
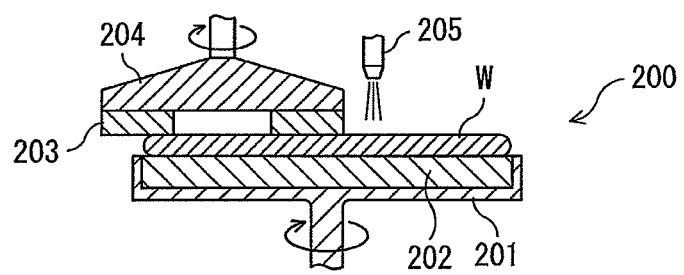

Since, in the fixed abrasive-grain processing step S30, the fixed abrasive-grain processing device 1 processes the wafers W with the fixed abrasive grains 21b and 31b having a small granularity less than 4 μm and being dispersed and fixed in elastic members 21a and 31a, respectively, the step S30 can obtain wafers W after subjected to the slicing step S10 whose surfaces have preferable flatness. At that time, the wafers W are in a free state of simply placing in the holes 4a of the carrier plate 4 (i.e., not in a state of being vacuum suctioned as performed in a conventional grinding device 200 shown in FIG. 18). That makes the wafers W possible to obtain fine nanotopography (waviness features that appear on the surfaces when the wafer W is not vacuum suctioned) in addition to the preferable flatness.

The elasticity of the elastic members 21a and 31a makes the elastic members 21a and 31a possible to properly absorb force that the fixed abrasive grains 21b and 31b apply to the wafers W when the fixed abrasive grains 21b and 31b are pressing against the wafers W, so that each wafer W can be prevented from being damaged by scratch caused by concentrating an excessive force to one point of the wafer W.

The use of fine abrasive grain having a granularity of less than 4 μm becomes possible because the fixed abrasive-grain processing device 1 fixes the abrasive grain that is to be used for processing. In other words, since the conventional lapping device 100 illustrated in FIG. 17 has used free abrasive grain, it has been difficult to use fine abrasive grain. Furthermore, although another conventional grinding device 200 could use fine abrasive grain because the device uses fixed abrasive-grain, the device has a low productivity because of single-wafer (single-slice) processing scheme.

Comparing with these conventional techniques, the present invention forms the lower fixed abrasive-grain layer 21 and the upper fixed abrasive-grain layer 31 made of the elastic members 21a and 31a, in which the fixed abrasive grains 21b and 31b are dispersed and fixed, on the surfaces of the lower surface-plate 2 and upper surface-plate 3, respectively, so that the fixed abrasive-grain processing device 1 is configured to dispose the fixed abrasive grains 21b and 31b at the respective fixed position. This configuration makes it possible to use fine abrasive grains 21b and 31b having diameters less than 4 μm and also makes it possible to process both surfaces of two or more wafers W at the same time to ensure the preferable productivity. Processing two or more wafers at the same time can refrain the required number of facilities and concurrently required area for processing from increasing.

Figure 19:
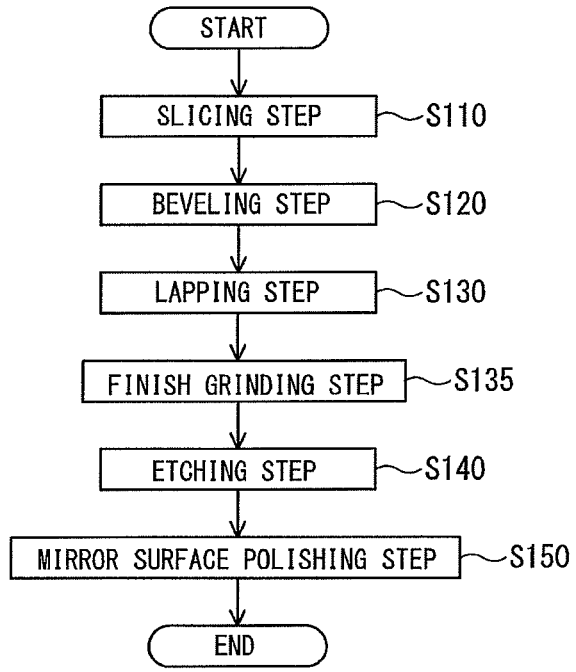
FIG. 19 A flow diagram illustrating a method of producing a semiconductor wafer according to an improved first conventional technique.
Figure 20:
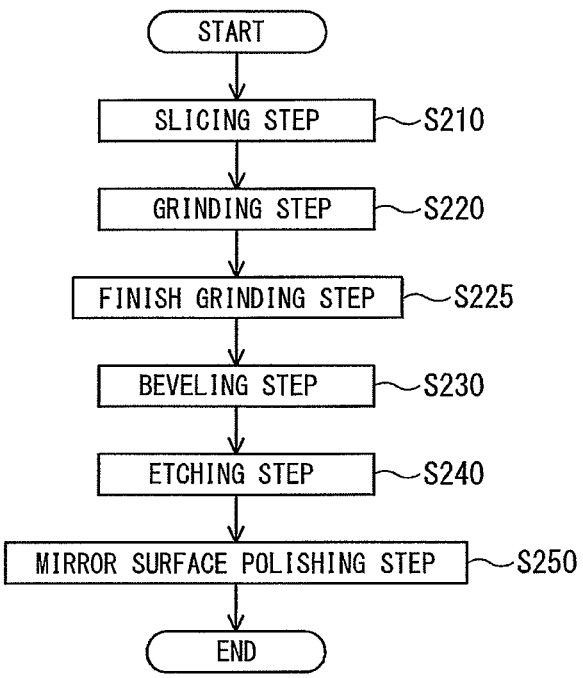
FIG. 20 A flow diagram illustrating a method of producing a semiconductor wafer according to an improved second conventional technique.

The fixed abrasive-grain processing step S30 can solely obtain the same flatness as that obtained by two conventional steps (the lapping step S130 and the finishing grinding step S135; or the grinding step S220 and the finishing grinding step S225) shown in FIG. 19 or 20. Therefore, the present invention can reduce the number of procedural steps as compared with conventional methods.

Such a less number of procedural steps can avoid increase in required facilities and, even in producing wafers having a large diameter, can avoid increase in area required for installing the facilities.

Since the fixed abrasive-grain processing device 1 sets the pressure that the lower surface-plate 2 and the upper surface-plate 3 apply to the top and the bottom surface of a semiconductor wafer W to be 250-400 g/cm$^2$ which is higher than a conventional value, it is possible to avoid scratches on the surfaces of the wafers and concurrently to maintain a higher processing rate than those of conventional techniques.

[Others]

The embodiment of the present invention was detailed as the above. However, the present invention should by no means be limited to the above embodiment and can be varied without departing from the sprit of the present invention.

For example, the method of producing a semiconductor wafer of the embodiment carries out steps S10 through S60 in order illustrated in FIG. 4. However, the sequence of these steps is not limited to that of FIG. 4 and can be varied. It is satisfactory that at least the fixed abrasive-grain processing step S30 is carried out after the slicing step S10 and before the mirror-surface polishing step S60. Otherwise, the fixed abrasive-grain processing step S30 may be carried out a number of times between the slicing step S10 and the mirror-surface polishing S60.

EXAMPLES

Next, description will now be made in relation to Examples of the method of fixed abrasive-grain processing of a semiconductor wafers through a use of the fixed abrasive-grain processing device of the present invention.

A single-crystal silicon ingot which is withdrawn from silicon melt which was doped with a predetermined amount of Boron through Czochralski process and which had a diameter of 306 mm, a straight cylinder length of 2500 mm, a specific resistance of 0.01 Ω·cm, and an initial oxygen concentration of $1.0 \times 10^{18}$ atoms/cm$^3$ was cut into a number of crystal blocks, whose outer circumferences were then ground. Specifically, an outer-circumference grinding device including a resinoid grindstone containing #200 abrasive grain (SiC) grounded the outer circumference of each crystal block by 6 mm. Thereby, each crystal block was formed into a cylinder. Next, each cylindrical crystal block was sliced with a wire saw and a number of silicon wafers (semiconductor wafers) W each having a thickness of 830 μm were thereby obtained. Then, a rotating beveling grindstone was pressed against the outer circumference of each silicon wafer W, so that the outer circumference of the silicon wafer W was chamfered.

Next, the fixed abrasive-grain processing device 1 illustrated in FIG. 1 concurrently grounded the top and the bottom surfaces of silicon wafers W. The used fixed abrasive-grain processing device 1 was a lapping device without a sun gear, which is detailed below.

To begin with, under a state of the upper surface-plate 3 apart from the lower surface-plate 2, three wafers W were set into three holes 4a formed on the carrier plate 4, which was made of glass epoxy and had a thickness of 700 μm, by a non-illustrated robot device. Then, the cylinder 7 moved the upper surface-plate 3 towards the lower surface-plate 2, and the press mechanism (not illustrated) pressed the lower surface-plate 2 (the lower fixed abrasive-grain layer 21) and the upper surface-plate 3 (the upper fixed abrasive-grain layer 31) against the bottom surface and the top surface of the wafers W. The pressure that the lower surface-plate 2 and the upper surface-plate 3 respectively applied to the top and the bottom surfaces of the wafers W was 150, 200, and 250 g/cm$^2$. Under this state, the lower surface-plate 2 and the upper surface-plate 3 rotated in different directions at 15 rpm, and the circular motion of the carrier plate 4 not accompanying the rotation around the center thereof was at a speed of 7.5 rpm.

The lower fixed abrasive-grain layer 21 and the upper fixed abrasive-grain layer 31 were made of hardening-polymer elastic members 21a and 31a in which diamond fixed abrasive grains 21b and 31b having a diameter of 2 μm was dispersed and fixed. The lower fixed abrasive-grain layer 21 and the upper fixed abrasive-grain layer 31 had thicknesses of 800 μm. The concentration ratio of the abrasive grain in each elastic member was 100 and 200. The amount of grinding of the total of the top and the bottom surfaces of each wafer W was 40-80 μm.

Figure 17:
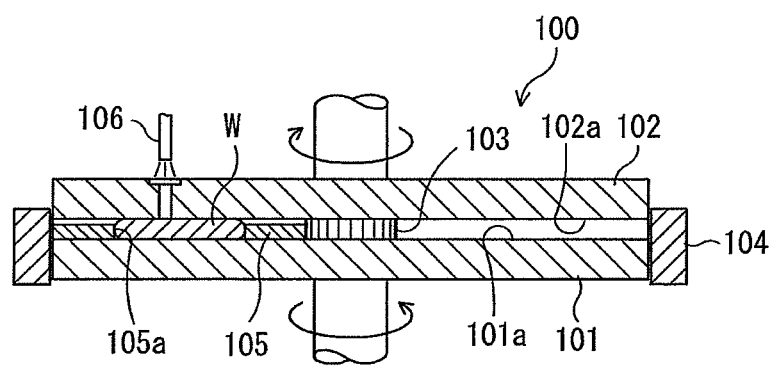
FIG. 17 A sectional view of a lapping device with a sun gear used for a method of producing a semiconductor wafer according to the first conventional technique.

Comparative Examples lapped the top and the bottom surfaces of silicon wafers W at the same time through the use of the lapping device 100 with a sun gear shown in FIG. 17 which was spraying lapping solution containing free abrasive grain. Comparative Examples had the same conditions of rotations of the lower surface-plate 101 and the upper surface-plate 102, and a speed of rotation of the carrier plate 105 not accompanying rotation of the carrier plate 105 around the center thereof as those of Examples, and set a pressure that the lower surface-plate 101 and the upper surface-plate 102 applied to the top and the bottom surfaces of the wafers W to be 150 g/cm$^2$.

Here, referring to FIGS. 8-14, description will now be made in relation to processing (grinding) rates and generation of scratches on the surface of a wafer when three silicon wafers having diameters of 300 mm were concurrently processed by the lapping device without a sun gear of Examples and the lapping device with a sun gear of Comparative Example. Scratches were detected with a device SP1 (trade name) that is a product of KLA-Tencor Corporation, which judged a surface defect having a length of 0.1 μm or more to be a scratch.

The lapping device 100 with a sun gear of FIG. 17 lapped silicon wafers W at a pressure of 150 g/cm$^2$, using a lapping solution containing free abrasive grain (Comparative Example 1). The fixed abrasive-grain processing device 1 illustrated in FIG. 1 processed silicon wafers W at a pressure of 150 g/cm$^2$ and a concentration ratio of 200 (Example 1).

Figure 8:
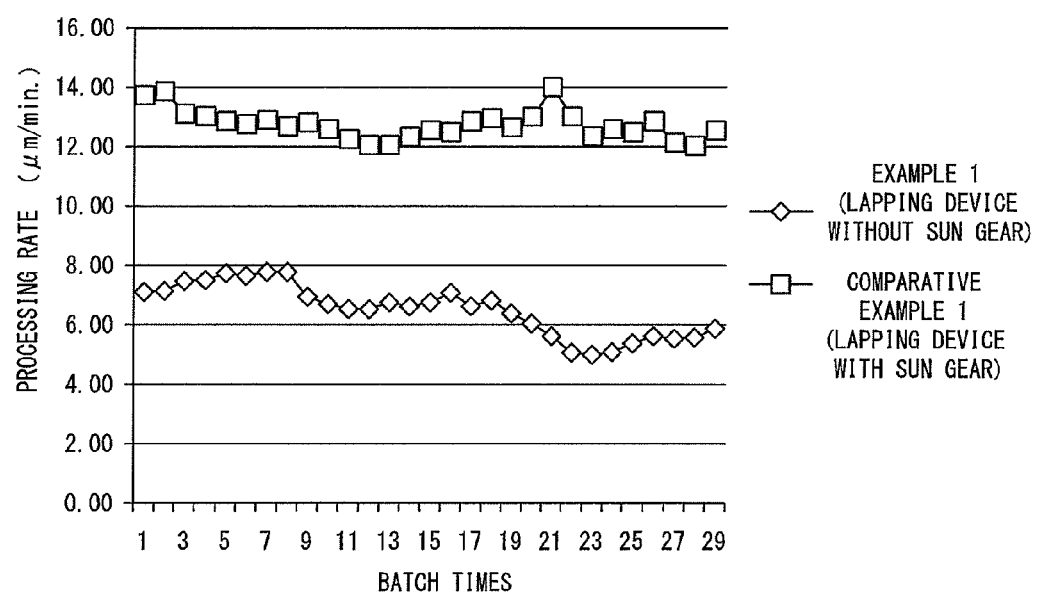
FIG. 8 A graph illustrating relationships between the number of batch times and a processing rate in semiconductor wafer processing by a lapping device with a sun gear and a lapping device without a sun gear under a condition of a pressure of 150 g/cm$^2$.
Figure 9:
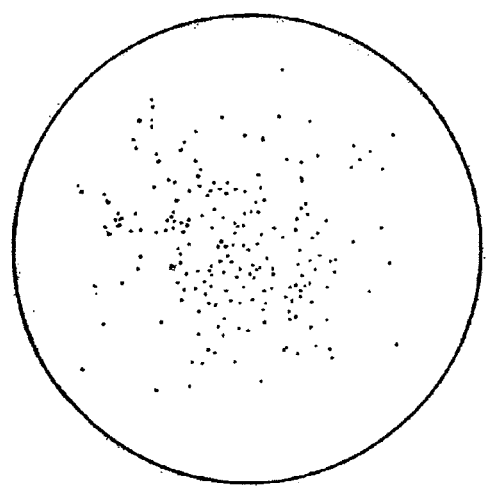
FIG. 9 A schematic diagram illustrating a distribution of scratches on the surface of a semiconductor wafer lapped by a lapping device with a sun gear under a condition of a pressure of 150 g/cm$^2$.

As a result, the processing rate of wafers W in Example 1 was about a half of that of Comparative Example 1 as illustrated in FIG. 8. FIG. 9 illustrates a distribution of scratches on the surface of a wafer of Comparative Example 1.

Figure 10:
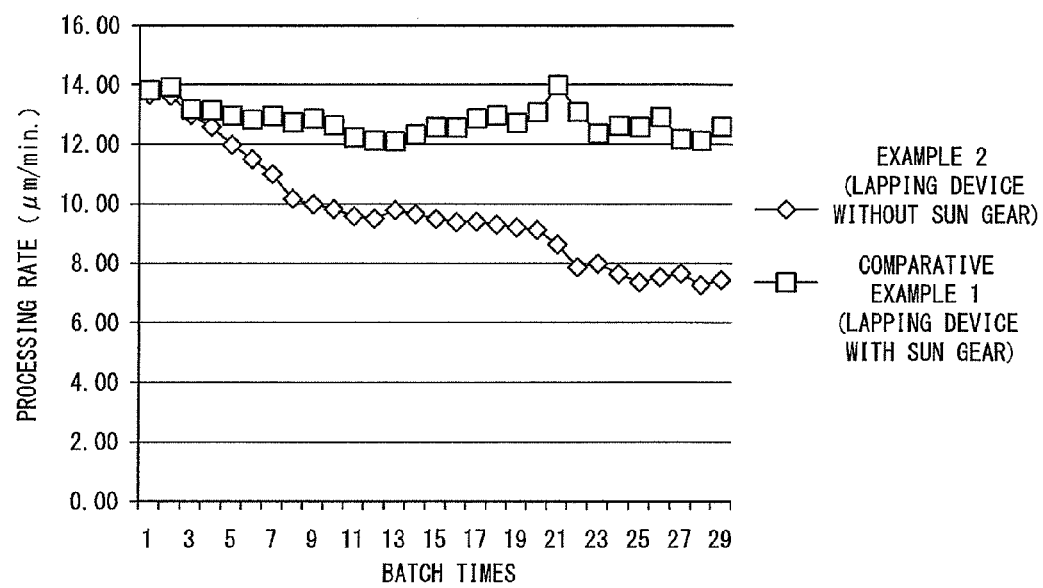
FIG. 10 A graph illustrating relationships between the number of batch times and a processing rate of semiconductor wafer processing by a lapping device with a sun gear and a lapping device without a sun gear under a condition of a pressure of 150 g/cm$^2$ and 200 g/cm$^2$, respectively.
Figure 11:
FIG. 11 A schematic diagram illustrating a distribution of scratches on the surface of a semiconductor wafer lapped by a lapping device with a sun gear under a condition of a pressure of 200 g/cm$^2$.

Next, the pressure of the processing in Example 1 was increased to 200 g/cm$^2$, so that the processing rate of Example 1 come to be equal to that of Comparative Example 1 (Example 2). As illustrated in FIG. 10, Example 2 had substantially the same processing rate as that of Comparative Example 1 at the initial stage of grinding, but the processing rate was gradually lowered due to continuous processing as the number of batches was increased. This is because fixed abrasive grains 21b and 31b that became incapable of grinding increased at the surface of the elastic members 21a and 31a as processing was repetitiously performed. In processing under a presence of a sun gear of Comparative Example 1, an increase of the pressure from 150 g/cm$^2$ to 200 g/cm$^2$ (Comparative Example 2) resulted in generation of several thousands scratches on the surface of a wafer as illustrated in FIG. 11.

Figure 12:
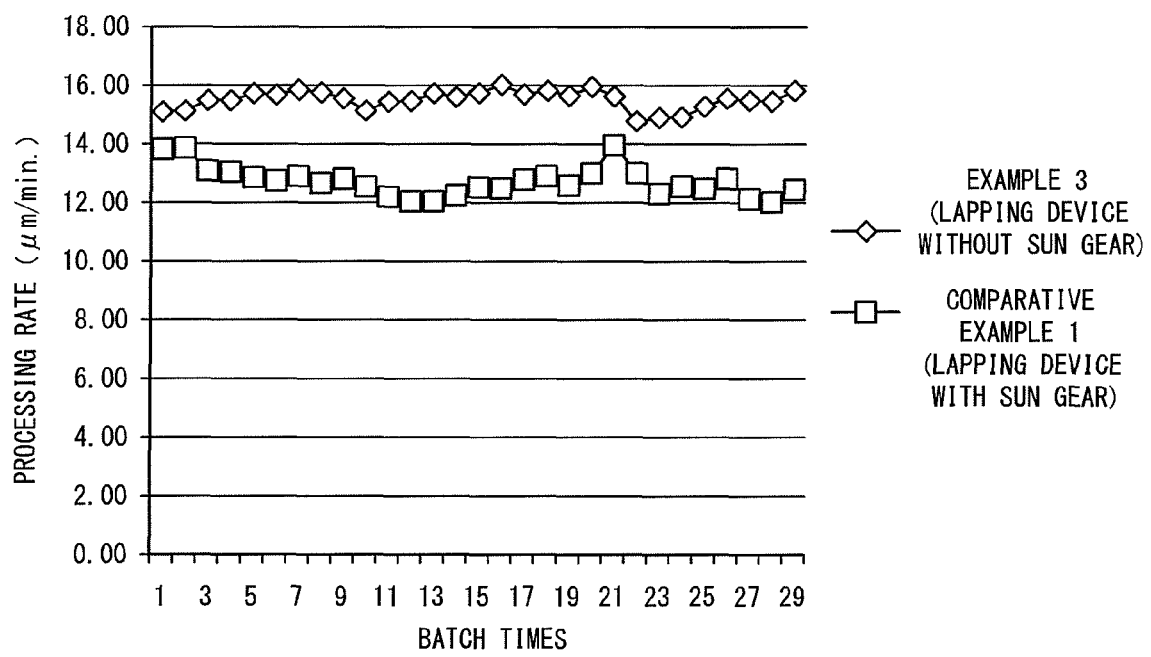
FIG. 12 A graph illustrating relationships between the number of batch times and a processing rate of semiconductor wafer processing by a lapping device with a sun gear and a lapping device without a sun gear under a condition of a pressure of 150 g/cm$^2$ and 250 g/cm$^2$, respectively.

Next, the pressure during the processing in Example 2 was increased to 250 g/cm$^2$ (Example 3), which resulted in a higher processing rate than that of Comparative Example 1 as illustrated in FIG. 12.

Figure 13:
FIG. 13 A schematic diagram illustrating a distribution of scratches on the surface of a semiconductor wafer processing by a lapping device without a sun gear under conditions of a concentration ratio of 200 and a pressure of 250 g/cm$^2$.

In the meantime, as illustrated in FIG. 13, Example 3 resulted in several hundreds scratches on the surface of a wafer due to a high concentration ratio of 200. This is because a large number of fixed abrasive grains 21b and 31b that became incapable of grinding due to processing were spread at the entire surfaces of the elastic members 21a and 31a, and even though the grinding is continued, the pressure was subdividedly dispersed to such fixed abrasive grains 21b and 31b incapable of grinding, which did not drop from the surfaces of the elastic members 21a and 31a and consequently did make scratches on the surface of the wafer.

Figure 14:
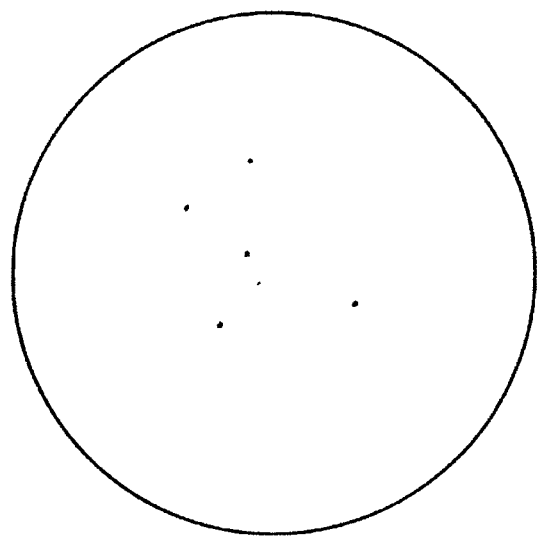
FIG. 14 A schematic diagram illustrating a distribution of scratches on the surface of a semiconductor wafer processing by a lapping device without a sun gear under conditions of a concentration ratio of 100 and a pressure of 250 g/cm$^2$.
Figure 15:
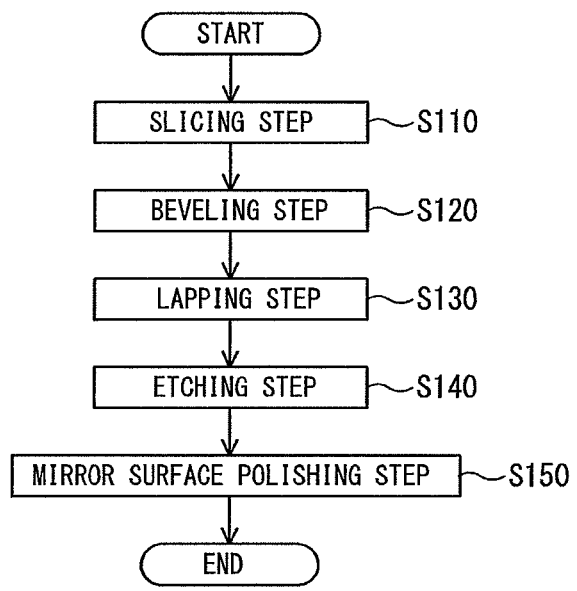
FIG. 15 A flow diagram illustrating a method of producing a semiconductor wafer according to a first conventional technique.
Figure 16:
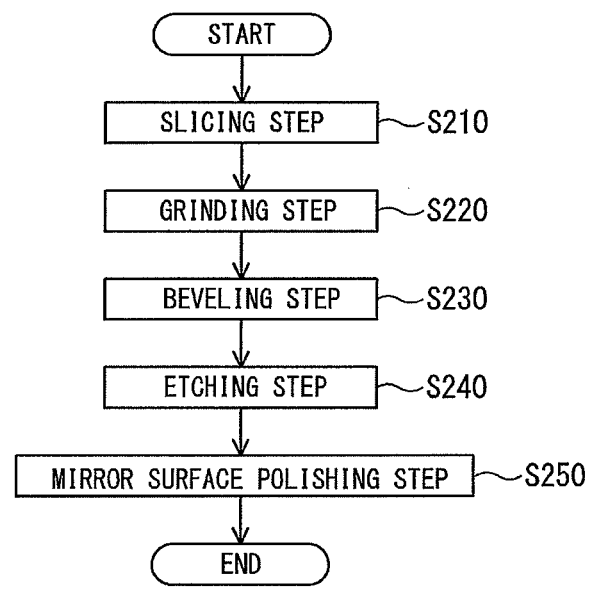
FIG. 16 A flow diagram illustrating a method of producing a semiconductor wafer according to a second conventional technique.

Among the conditions of Examples 3, the pressure was kept to be 250 g/cm$^2$ and the concentration ratio was lowered to 100 (Example 4). As a result of Example 4, loads were intensively applied to fixed abrasive grains 21b and 31b which came to be incapable of grinding during processing and encouraged such fixed abrasive grains 21b and 31b to drop from the surface of the elastic members 21a and 31a, so that the next-stage fixed abrasive grains 21b and 31b came to be easily exposed. This made it possible to always keep high grindability of both top and bottom surfaces of a wafer, which consequently decreased scratches on the surface of the wafer to about 5 as illustrated in FIG. 14.

DESCRIPTION OF REFERENCE SYMBOLS

1 fixed abrasive-grain processing device
2 lower surface-plate
21 fixed abrasive-grain layer (lower fixed abrasive-grain layer)
21a elastic member
21b fixed abrasive grain (abrasive grain)
21c intermediate layer
3 upper surface-plate
31 fixed abrasive-grain layer (upper fixed abrasive-grain layer)
31a elastic member
31b fixed abrasive grain (abrasive grain)
31c intermediate layer
4 carrier plate
4a hole
40 carrier rotating device
41 basement
42 carrier holder
43 eccentric arm
43a base
43b eccentric axis 43c rotating axis
44 sprocket
45 timing chain
46 small gear
47 motor (carrier motor)
48 large gear
5 motor (motor for lower surface-plate)
6 motor (motor for upper surface-plate)
7 cylinder (lifting device)
100 lapping device
200 grinding device
$O_1$ axis of rotation of lower surface-plate and upper surface-plate
$O_2$ central axis of carrier plate and carrier holder

The invention claimed is:

1. A method of fixed abrasive-grain processing of a plurality of semiconductor wafers to a flatness as that obtained by a two-step process of a conventional lapping step and a finishing grinding step, the method comprising:
   using a fixed abrasive-grain processing device including:
      a disk-shaped lower surface-plate horizontally disposed; a lower fixed abrasive-grain layer that is adjacent to a top surface of the lower surface-plate that grinds top surfaces of the plurality of semiconductor wafers, the lower fixed abrasive-grain layer comprising a lower elastic member comprising hardening polymer resin, the lower fixed abrasive-grain layer further comprising abrasive grains each having a diameter of less than 4 μm embedded in the lower elastic member; wherein the abrasive grains in the lower elastic member have a concentration ratio of 100-150;
      a first motor that rotates the lower surface-plate around an axis of rotation;
      a disk-shaped upper surface-plate that horizontally overlies the lower surface-plate; an upper fixed abrasive-grain layer that is adjacent to a bottom surface of the upper surface-plate that grinds bottom surfaces of the plurality of semiconductor wafers, the upper fixed abrasive-grain layer comprising an upper elastic member comprising hardening polymer resin, the upper fixed abrasive-grain layer further comprising abrasive grains each having a diameter of 4 μm or less embedded in the upper elastic member; wherein the abrasive grains in the upper elastic member have a concentration ratio of 100-150;
      a second motor that rotates the upper surface-plate around the axis of rotation;
      a carrier plate that is horizontally interposed between the lower surface-plate and the upper surface-plate and that includes a plurality of holes each accommodating one of the plurality of semiconductor wafers; and
      a carrier rotating device that circularly moves the carrier plate;
   vertically separating the upper surface-plate from the lower surface-plate,
   setting the plurality of semiconductor wafers in the holes of the carrier plate;
   bringing the upper surface-plate close to the lower surface-plate;
   applying a pressure of 250-400 g/cm² by the lower fixed abrasive-grain layer and the upper fixed abrasive-grain layer against the top surfaces and the bottom surfaces of the plurality of semiconductor wafers, respectively;
   performing a single step planarizing of the top surfaces and the bottom surfaces of the plurality of semiconductor wafers at the same time at a processing rate of greater than 14 μm/min by concurrently rotating the lower surface-plate and the upper surface-plate in opposite rotational directions about the axis of rotation, and circularly moving the carrier plate using the carrier rotating device while maintaining the pressure by the lower fixed abrasive-grain layer and the upper fixed abrasive-grain layer against the top surfaces and the bottom surfaces, respectively, of the plurality of semiconductor wafers.

2. The method according to claim 1, wherein the hardening polymer resin comprises one of epoxy resin, phenolic resin, acrylicurethane resin, polyurethane resin, vinyl chloride resin and fluorinated resin.

3. A method for producing a semiconductor wafer including a fixed abrasive-grain processing of the semiconductor wafer to a flatness as that obtained by a two-step process of a conventional lapping step and a finishing grinding step, the method comprising:
   performing a slicing operation to slice a single-crystal ingot into a plurality of semiconductor wafers; and
   after the slicing operation, using a fixed abrasive-grain processing device including:
      a disk-shaped lower surface-plate horizontally disposed; a lower fixed abrasive-grain layer that is adjacent to a top surface of the lower surface-plate that grinds top surfaces of the plurality of semiconductor wafers, the lower fixed abrasive-grain layer comprising a lower elastic member comprising hardening polymer resin, the lower fixed abrasive-grain layer further comprising abrasive grains each having a diameter of 4 μm or less embedded in the lower elastic member; wherein the abrasive grains in the upper elastic member have a concentration ratio of 100-150;
      a first motor that rotates the lower surface-plate around an axis of rotation; a disk-shaped upper surface-plate that horizontally overlies the lower surface-plate; an upper fixed abrasive-grain layer that is adjacent to a bottom surface of the upper surface-plate that grinds bottom surfaces of the plurality of semiconductor wafers, the upper fixed abrasive-grain layer comprising an upper elastic member comprising hardening polymer resin, the upper fixed abrasive-grain layer further comprising abrasive grains each having a diameter of less than 4 μm embedded within the upper elastic member; wherein the abrasive grains in the upper elastic member have a concentration ratio of 100-150;
      a second motor that rotates the upper surface-plate around the axis of rotation;
      a carrier plate that is horizontally interposed between the lower surface-plate and the upper surface-plate and that includes a plurality of holes each accommodating one of the plurality of semiconductor wafers; and
      a carrier rotating device that circularly moves the carrier plate;
   vertically separating the upper surface-plate from the lower surface-plate,
   setting the plurality of semiconductor wafers in the holes of the carrier plate;
   bringing the upper surface-plate close to the lower surface-plate;
   applying a pressure of 250-400 g/cm² by the lower fixed abrasive-grain layer and the upper fixed abrasive-grain layer against the top surfaces and the bottom surfaces of the plurality of semiconductor wafers, respectively;

performing a single step planarizing of the top surfaces and the bottom surfaces of the plurality of semiconductor wafers at the same time at a processing rate of greater than 14 µm/min by concurrently rotating the lower surface-plate and the upper surface-plate in opposite rotational directions about the axis of rotation, and circularly moving the carrier plate using the carrier rotating device while maintaining the pressure by the lower fixed abrasive-grain layer and the upper fixed abrasive-grain layer being in contact with the top surfaces and the bottom surfaces, respectively, of the plurality of semiconductor wafers;

after the single step planarizing, mirror-surface polishing the top surfaces and the bottom surfaces, or at least the top surfaces of the plurality of semiconductor wafers until the top surface and the bottom surface, or at least the top surface exhibits a mirror surface.

4. The method according to claim 3, further comprising:
after the fixed abrasive-grain processing and before the mirror-surface polishing,
beveling edges of the plurality of semiconductor wafers ground in the fixed abrasive-grain processing; and
after the beveling and before the mirror-surface polishing, single-wafer etching one of the plurality of semiconductor wafers at each time by spraying a surface of the one semiconductor wafer in a rotating state with an etching solution.

5. The method according to claim 3, wherein the hardening polymer resin comprises one of epoxy resin, phenolic resin, acrylicurethane resin, polyurethane resin, vinyl chloride resin and fluorinated resin.

* * * * *